United States Patent [19]

Yoshida et al.

[11] Patent Number: 5,083,181

[45] Date of Patent: Jan. 21, 1992

[54] SEMICONDUCTOR INTEGRATED CIRCUIT DEVICE AND WIRING METHOD THEREOF

[75] Inventors: Nobuo Yoshida, Ohme; Kazuo Koide, Hamura, both of Japan

[73] Assignee: Hitachi, Ltd., Tokyo, Japan

[21] Appl. No.: 275,520

[22] Filed: Nov. 23, 1988

[30] Foreign Application Priority Data

Nov. 27, 1987 [JP] Japan .................................. 62-297513

[51] Int. Cl.⁵ ...................... H01L 27/10; H01L 27/15; H01L 23/48
[52] U.S. Cl. ........................................ 357/45; 357/68; 357/40; 357/71; 307/443; 307/465; 307/468
[58] Field of Search ........................ 357/40, 45, 68, 65, 357/41, 71; 307/303, 443, 465, 468, 480–481; 364/490, 491, 489

[56] References Cited

U.S. PATENT DOCUMENTS

| | | | |
|---|---|---|---|
| 4,591,894 | 5/1986 | Kawakami | 357/68 |
| 4,656,370 | 4/1987 | Kanuma | 307/303 |
| 4,857,765 | 8/1989 | Cahill et al. | 307/443 |

FOREIGN PATENT DOCUMENTS

| | | | |
|---|---|---|---|
| 0278857 | 8/1988 | European Pat. Off. | 357/45 |
| 57-72362 | 5/1982 | Japan | 357/45 |
| 59-4234 | 1/1984 | Japan | 357/45 |
| 60-22336 | 2/1985 | Japan | 357/45 M |
| 60-234341 | 11/1985 | Japan | 357/69 |
| 61-82454 | 4/1986 | Japan | 357/40 |
| 61-208237 | 9/1986 | Japan | 357/45 M |
| 63-120456 | 5/1988 | Japan | 357/40 |
| 63-126263 | 5/1988 | Japan | 357/40 |

OTHER PUBLICATIONS

Itoh et al., "Array and Gb Logic", 2/11/82, pp. 176 abd 177, Digest of Technical Papers.

Primary Examiner—Rolf Hille
Assistant Examiner—Minh Loan Tran
Attorney, Agent, or Firm—Antonelli, Terry, Stout & Kraus

[57] ABSTRACT

In a gate array including a plurality of output buffer circuits whose output levels change simultaneously with one another, a power source voltage or a reference voltage is supplied to the plurality of output buffer circuits whose output levels change simultaneously with one another by the same and exclusive power source voltage wiring or reference voltage wiring and is separated from power source voltage wirings or reference voltage wirings connected to other output buffer circuits and this wiring design is made by DA (Design Automation) combining fixed patterns with connection patterns. This designing method can prevent any adverse influences of the operations of the output buffer circuits whose output levels change simultaneously with one another on the other output buffer circuits and on input buffer circuits.

34 Claims, 7 Drawing Sheets

SEMICONDUCTOR INTEGRATED CIRCUIT DEVICE AND WIRING METHOD THEREOF

BACKGROUND OF THE INVENTION

This invention relates generally to a semiconductor integrated circuit device. More particularly, the present invention relates to a technique which will be effective when applied to a semiconductor integrated circuit device for constituting various gates by wiring basic cell transistors with one another.

A gate array is one of the semiconductor integrated circuit devices employing a master slice system which makes it possible to design a small quantity of various kinds of devices within a short period. The gate array is primarily used as an interface of a CPU (Central Processing Unit). The gate array inputs an external signal to a gate formed in a logic area through an input buffer circuit of a peripheral portion and outputs the output signal from the gate of the logic area to the outside through an output buffer circuit of the peripheral portion. Thus a large number of input buffer circuits and output buffer circuits are disposed at the peripheral portions of the semiconductor chip constituting the gate array. A power source voltage $V_{cc}$, e.g. 5 V, must be supplied to transistors constituting these input and output buffer circuits while a reference potential $V_{ss}$, e.g. a ground potential of 0 V, must be supplied also to them. The power source voltage $V_{cc}$ and reference potential $V_{ss}$ are supplied through power source wirings and reference voltage wirings that extend on the input buffer circuits and the output buffer circuits described above.

SUMMARY OF THE INVENTION

In the course of studies of these power source voltage wirings and reference voltage wirings, the inventors of the present invention have found the following problems.

The disposition of the input buffer circuits and the output buffer circuits on the semiconductor chip changes or varies in accordance with users' demand. This change can be made by changing a wiring pattern (a mask pattern at a wiring formation step) to be applied to the master wafer. Particularly because a CPU performs a parallel operation such as with respect to 8 bits and 16 bits, some of the output buffer circuits of the gate array cause the shifting from an "H" level to an "L" level simultaneously or, for that matter the shifting from the "L" level to the "H" level, and the number of such output buffer circuits perform simultaneous level shifting is one or more multiples required for a byte, such as eight or sixteen. If the outputs of a large number of output buffer circuits adjacent to one another switch simultaneously as described above, the potential of the power source voltage wirings connected thereto or the potential of the reference voltage wirings connected thereto changes greatly. Particularly in the case with respect to the reference voltage wirings, if there are a large number of output buffers that are connected to the wirings and these output buffers switch simultaneously with one another from the "H" level to the "L" level, the charge that has been stored in the load capacitances corresponding to such a large number of output buffers is discharged and an excessive current flows so that the potential of the reference voltage wiring rises. Accordingly, other buffer circuits are likely to cause an erroneous operation.

It is therefore an object of the present invention to improve reliability of buffer circuits of a semiconductor integrated circuit device constituting various gates by connecting wirings.

In a semiconductor integrated circuit device employing a master slice system, it is another object of the present invention to provide a technique that can accomplish the object described above.

These and other objects and novel features of the present invention will become more apparent from the following description when taken in conjunction with the accompanying drawings.

Among the novel features disclosed herein in connection with the present invention, the following will illustrate a typical example.

A plurality of output buffer circuits that switch simultaneously with one another receive the supply of a power source potential or a reference potential by the same power source voltage wiring or the same reference voltage (ground voltage) wiring disposed exclusively for them, and those power source voltage wirings or reference voltage wirings connected to other output buffer circuits are disposed separately from the power source voltage wiring or reference voltage wiring connected to the plurality of output buffer circuits that switch simultaneously with one another.

Wiring design of the exclusive power source voltage wiring or reference voltage wiring connected to the plurality of output buffer circuits that switch simultaneously with one another and of the power source voltage wirings or reference voltage wirings connected to the other output buffer circuits is made by determining whether or not a connection pattern is added to a fixed pattern which is laid out irrespective of what function or functions the buffer circuits may have.

According to the means described above, the operation of the output buffer circuits that switch simultaneously with one another does not adversely affect the other or remaining input buffer circuits or output buffer circuits so that reliability of all of the buffer circuits can be improved.

DESCRIPTION OF THE PREFERRED EMBODIMENTS

Figure 1:
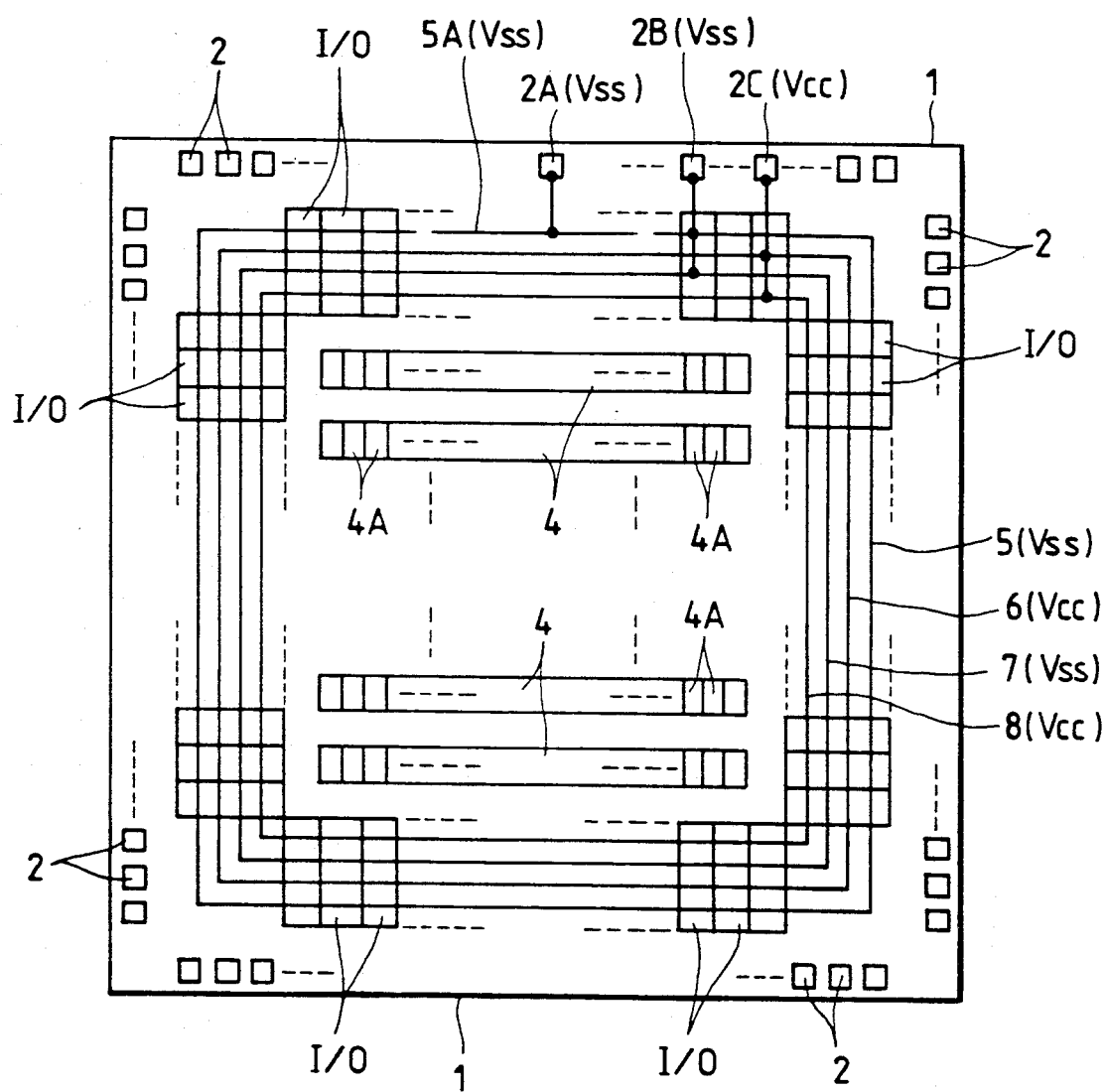
FIG. 1 is a schematic plan view of a semiconductor chip.

Hereinafter the present invention will be described with reference to the embodiments thereof applied to a semiconductor integrated circuit device employing a master slice system.

Throughout the drawings like reference numerals will be used to identify like constituents having the same function and the repetition of explanation of such constituents will be omitted.

FIG. 1 is a plan view showing schematically a semiconductor integrated circuit device in accordance with one embodiment of the present invention.

In FIG. 1, reference numeral 1 represents a semiconductor substrate made of single crystal silicon and it constitutes a gate array type semiconductor integrated circuit device. Bonding pads 2, 2A, 2B, 2C are disposed at the peripheral portions of the semiconductor chip 1. The bonding pad 2 is for an input signal or an output signal while the bonding pads 2A, 2B are for a reference potential, e.g. 0 V, and the bonding pad 2C is for a power source potential, e.g. 5 V. An I/O area in which input buffer circuits or output buffer circuits of the semiconductor integrated circuit device are constituted is formed inside the bonding pads 2, 2A, 2B, 2C (i.e., further away from the chip edge than the bonding pads). An inner area encompassed (surrounded) by each I/O area is an internal circuit area. As disclosed, for example, in Japanese Patent Application No. 146518/1985 and ISSCC 82 DIGEST OF TECHNICAL PAPERS PP. 176-177, a basic cell 4A is formed by a series circuit of three P-channel MISFETs and a series circuits of three N-channel MISFETs and these basic cells 4A are arranged repeatedly to constitute basic cell arrays 4 (i.e., individual lines of basic cells). The basic cells 4A and the basic cell arrays 4 are mutually connected, respectively, by aluminum wirings to form various logic gates and clock buffers.

There are disposed on the I/O areas the reference potential wirings 5, 5A for supplying a reference potential, e.g. 0 V, and the power source voltage wiring 6 for supplying the power source voltage, e.g. 5 V, which is more centrally (or more inwardly) disposed on the chip than the reference potential wirings 5, 5A. Furthermore, the reference voltage wirings 7, which is more inwardly disposed than wiring 6, for supplying the reference potential to the internal circuits and the power source voltage wiring 8, which is even more inwardly disposed than wirings 7, for supplying the power source voltage extend on the I/O areas. The reference potential and the power source voltage are supplied from the reference potential wirings 7 and the power source voltage wiring 8 to the input buffer circuit, respectively. These reference voltage wirings 5, 5A, 7 and the power source voltage wirings 6, 8 are formed, for example, by the second layer aluminum film. Auxiliary power source voltage wirings (not shown) that extend in the same direction as the power source voltage wirings 6, 8, for example, may be formed by a third layer aluminum film.

The reference voltage wiring 5A is disposed exclusively for those output buffer circuits among a large number of output buffer circuits which shift simultaneously from the "H" level to the "L" level and which shift simultaneously from the "L" level to the "H" level, and is not connected to those output buffer circuits which do not shift simultaneously and to the input buffer circuits. The reference potential $V_{ss}$ is supplied to the output buffer circuits —other— than those which shift simultaneously—by the reference potential wiring 5 which is different from the reference potential wiring 5A. As described above, the reference potential wirings for supplying the reference potential to the output buffer circuits which switch simultaneously and to the other output buffer circuits are divided into the reference potential wiring 5A and the reference potential wiring 5 respectively. In this manner, it is possible to prevent the potential rise of the reference potential wiring 5A occurring when the respective outputs, of the output buffer circuits which switch simultaneously with one another changes from the "H" level to the "L" level from affecting adversely the output buffer circuits which do not switch simultaneously therewith and, for that matter, with each other and likewise the input buffer circuits.

Figure 2:
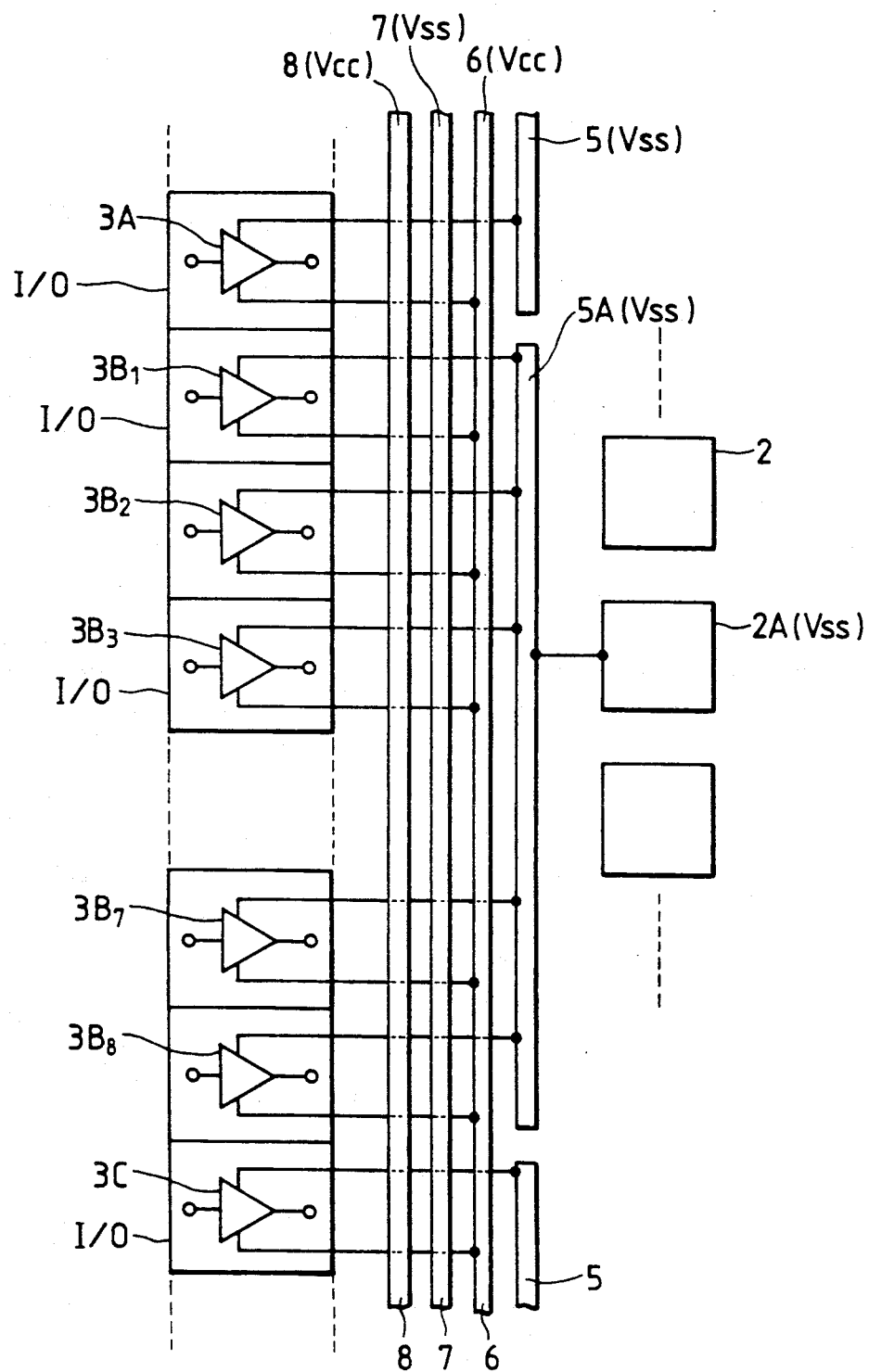
FIG. 2 is a schematic circuit diagram of output buffer circuits that switch simultaneously with one another.

FIG. 2 shows schematically the output buffer circuits which switch simultaneously with one another.

In FIG. 2, reference numeral 3A represents the output buffer circuits which do not switch simultaneously with one another and the reference potential is supplied thereto by the reference potential wiring 5. Reference numerals $3B_1$–$3B_8$ represent the output buffer circuits which perform the switching operation simultaneously with one another and the reference potential is supplied to them by the reference potential wiring 5A. Reference numeral 3C represents the output buffer circuits which do not switch simultaneously with the output buffer circuits 3A, $3B_1$, $-3B_8$ and the reference potential is supplied by the reference potential wiring 5. The power source potential is supplied to all the output buffer circuits 3A, $3B_1$–$3B_8$, 3C by the same power source voltage wiring 6. Incidentally, the output buffer circuits which switch simultaneously with one another are not necessarily limited to the eight output buffer circuits $3B_1$–$3B_8$ and the number of such output buffer circuits is at least two and changes variously in accordance with users' demand such as 16, 24, 32, and so forth.

Here, the number of the output buffer circuits 3A may be such that the output buffer circuits which switch simultaneously with them do not affect adversely the potential of the reference potential wiring, e.g. 2 or 3.

Figure 3:
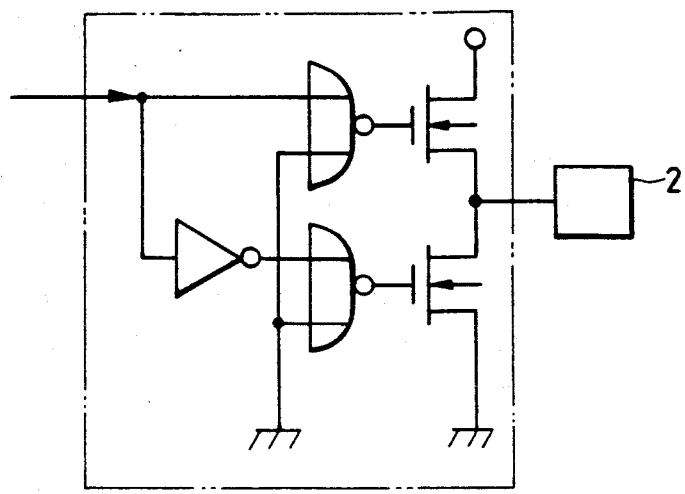
FIG. 3 is a circuit diagram of the output buffer circuit.
Figure 4:
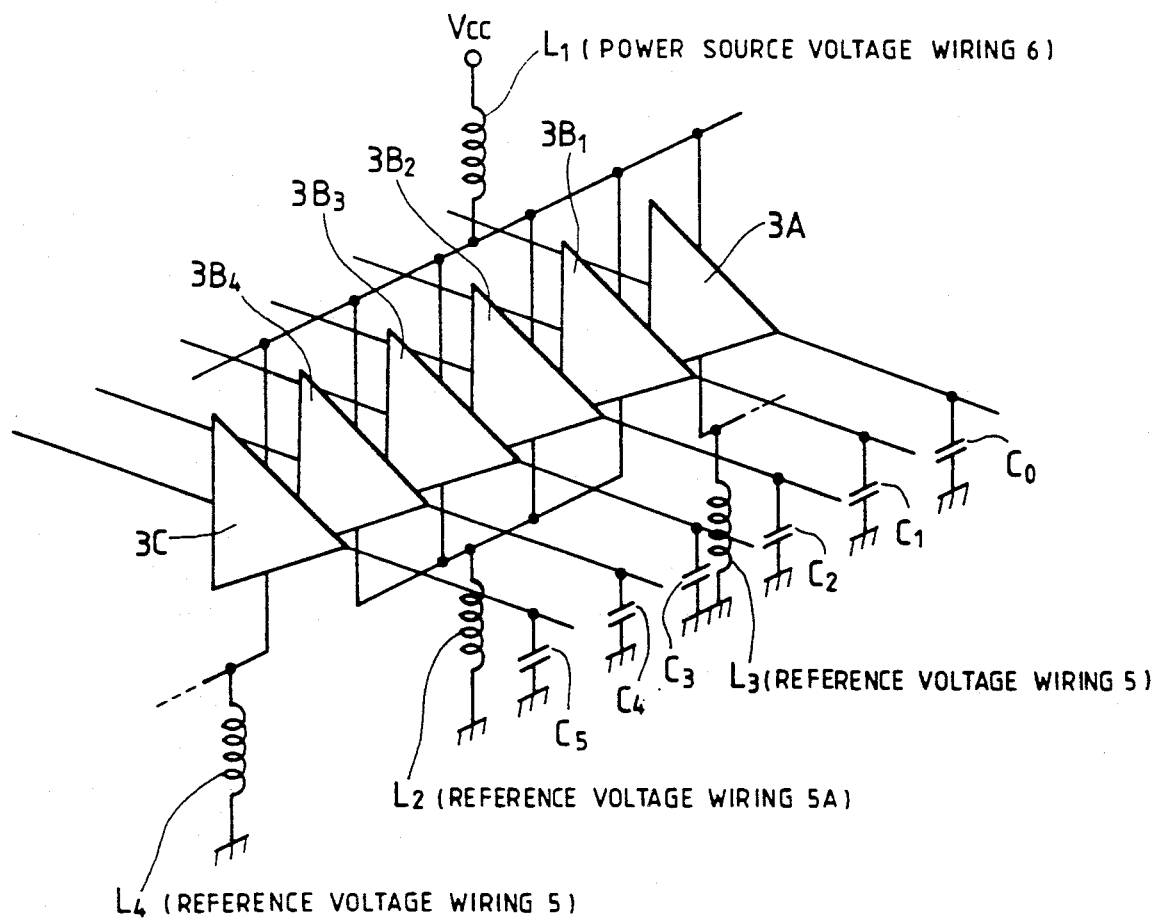
FIG. 4 is an equivalent circuit diagram of reference voltage wirings and power source voltage wirings.
Figure 5:
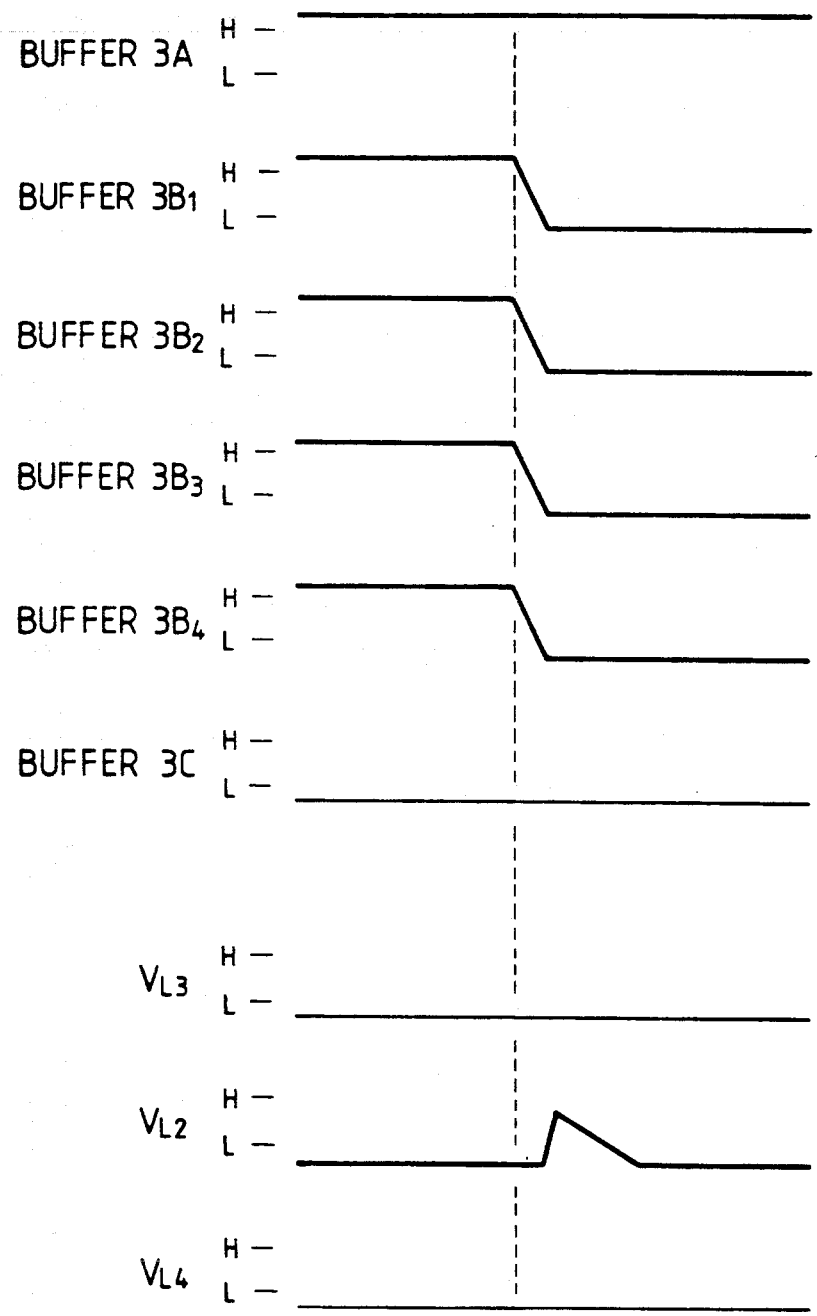
FIG. 5 is a timing chart of the output buffer circuits when they shift from an "H" level to an "L" level.

The reference voltage wirings 5, 5A and the power source voltage wiring 6 can be expressed equivalently as shown in FIG. 4. FIG. 3 is a circuit diagram of the output buffer, and FIG. 4 shows only the output buffer circuits 3A, $3B_1$–$3B_4$, 3C in order to simplify the illustration. FIG. 5 is a timing chart when these output buffer circuits 3A, $3B_1$–$3B_4$, 3C shift from the "H" level to the "L" level.

In FIG. 4, $L_1$ is the inductance of the power source voltage wiring 6, $L_2$ is the inductance of the reference voltage wiring 5A, $L_3$ is the inductance when the reference voltage wiring 5 is viewed from the side of the output buffer circuit 3A and $L_4$ is the inductance when the reference voltage wiring 5 is viewed from the side of the output buffer circuit 3C. Symbols $C_0$–$C_5$ represent the load capacitances of the output buffer circuits 3A, $3B_1$–$3B_4$, 3C, respectively. It will be assumed hereby that the outputs of the output buffer circuits 3A, $3B_1$–$3B_4$ are at the "H" level and the output of the output buffer circuit 3C is at the "L" level. Next, when the output buffer circuits $3B_1$–$3B_4$ switch simultaneously from the "H" level to the "L" level, the charge that has been stored in the load capacitances $C_1$–$C_4$ is discharged to the reference voltage wiring 5A. Since the inductance $L_2$ exists in the reference voltage wiring 5A at this time, the potential $V_{L2}$ of the reference voltage wiring 5A rises as shown in FIG. 5. Since the threshold value of the logic level is set to a low value of about 1.4 V, the potential raised by the discharge described above often exceeds the threshold value. In the present invention, however, the reference voltage wiring 5A and the reference voltage wiring 5 are separated from each other so that the potential rise of the reference voltage wiring 5A does not cause the inversion of the output buffer circuit 3C which is at the "L" level.

On the other hand, when the output buffer circuits $3B_1$-$3B_4$ rise from the "L" level to the "H" level, the potential of the power source voltage wiring 6 drops due to the inductance $L_1$ but since the difference from the power source potential $V_{cc}$, e.g. 5 V, to the threshold value of the logic, e.g. 1.4 V, is great, the potential drop does not become lower than the threshold value. Therefore, the present invention supplies the power source potential $V_{cc}$ to the output buffer circuits 3A, $3B_1$-$3B_4$ ($3B_1$-$3B_8$ in FIG. 2), 3C and to the input buffer circuits by the same power source voltage wiring 6.

Incidentally, if the potential difference from the power source potential $V_{cc}$ to the threshold value of the logic is not large enough the power source voltage wiring for supplying the power source potential $V_{cc}$ to the output buffer circuits $3B_1$-$3B_4$ whose oupus switch simultaneously may deposed so as to be independent of the power source wiring for supplying the power source voltage to the other output buffer circuits 3A, 3C and to the input buffer circuits.

The bonding pad 2A is disposed exclusively for the reference voltage wiring 5A separately from the bonding pad 2B connected to the reference voltage wirings 5, 7. The power source voltage wirings 6 and 8 are connected to the same bonding pad 2C.

Incidentally, if the number of the output buffer circuits which switch simultaneously with one another becomes great, the drop of the potential of the power source voltage wiring 6 at the time of the rise from the "L" level to the "H" level becomes great. Therefore, only the portion of the output buffer circuits which make simultaneously the switching operation may be disposed separately. In such a case, the power source voltage wiring 6 disposed separately for these output buffer circuits making the simultaneous switching operation is preferably equipped with the exclusive bonding pad 2 for supplying the power source potential $V_{cc}$ separately from the bonding pad 2C.

Next, the wiring design of the reference voltage wirings 5, 5A, 7 and the power source voltage wirings 6, 8 will be described.

Figure 6:
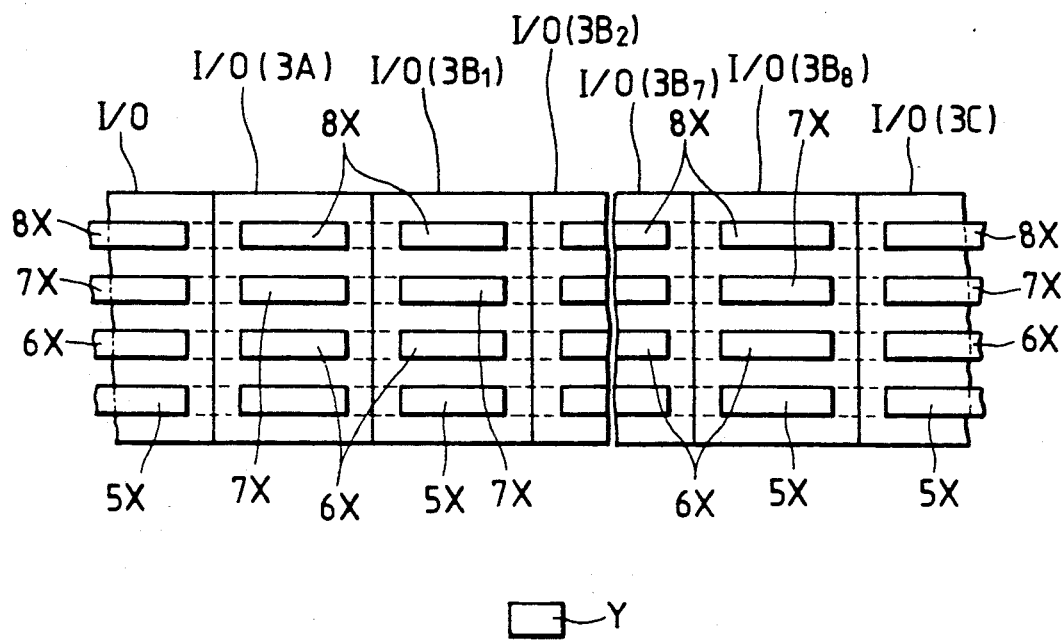
FIGS. 6 to 8 are drawings useful for explaining wiring design of reference voltage wirings and power source voltage wirings.
Figure 7:
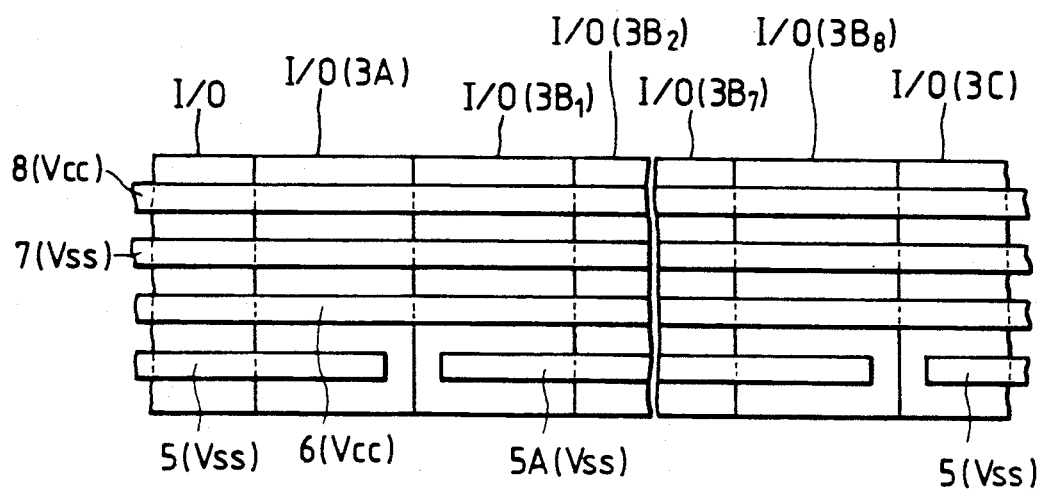

FIGS. 6 and 7 are drawings which are useful for explaining the wiring design of the reference voltage wirings 5, 5A, 7 and the power source voltage wirings 6, 8.

The circuit devices of the basic cells 4A and the I/O cells such as MIS (Metal Insulator Semiconductor) type field effect transistors (MISFETs), resistors, etc., and the first layer aluminum wirings include wirings for constituting the input/output circuits inside the I/O cells. In FIG. 6, reference numerals 8X, 7X, 6X and 5X represent fixed patterns of the second layer aluminum film, for example, for designing the reference potential wirings 5, 5A, 7 and the power source voltage wirings 6, 8, respectively, and they are laid out with predetermined gaps between them in the I/O areas by DA (Design Automation) irrespective of what the buffer circuits to be constituted may be. Depending on whether or not the connection pattern Y consisting of the second layer aluminum wiring is to be disposed in the portions between the fixed patterns 8X and 8X, between 7X and 7X, between 6Xand 6X and between 5X and 5X, that is, the portions represented by dotted lines, the reference voltage wirings 5, 5A, 7 and the power source wirings 6, 8 are designed as shown in FIG. 7. Even if the disposition of the output buffer circuits switching simultaneously on the chip 1 changes in various manners, this method makes it possible to dispose the cut-off portions of the reference voltage wiring 5A from the reference voltage wirings 5A and the reference voltage wiring 5 at all positions on the chip 1. Incidentally, in the design of the reference voltage wirings 5, 5A, 7 and the power source voltage wirings 6, 8, whether or not the portions between the fixed patterns 8X and 8X, between 7X, and 7X, between 6X and 6X and between 5X and 5X are to be connected respectively is determined in accordance with users' demand and the connection pattern Y is disposed and laid out by DA on the basis of this information.

In this embodiment, the cut-off portions are not necessary for the reference voltage wiring 7 and the power source voltage wirings 6, 8. Therefore, the reference voltage wiring 7 and the power source voltage wirings 6, 8 may be designed as a fixed pattern in its entirety rather than designing them by the fixed patterns 6X, 7X, 8X and the connection pattern Y.

Figure 8:
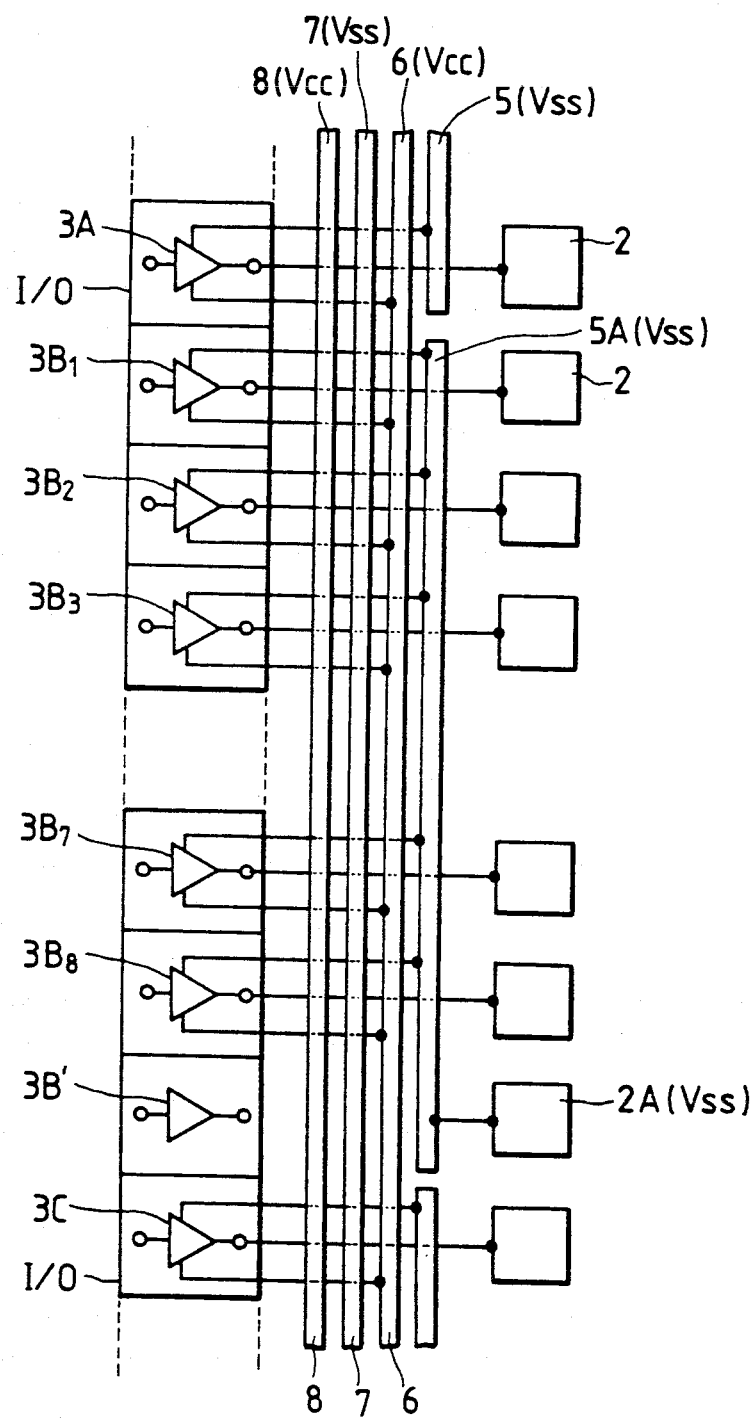

Next, the disposition of the bonding pad 2A for supplying the reference voltage to the reference voltage wiring 5A will be explained with reference to FIG. 8. The information from the user reveals that the output buffer circuits $3B_1$-$3B_8$ are those output buffer circuits having output levels which switch simultaneously and which are connected to the reference voltage wiring 5A which is cut off from the reference voltage wiring 5 to which other output buffer circuits and the input buffer circuits are connected. Each bonding pad is disposed in such a manner as to correspond to each output buffer circuit and is connected to each corresponding output buffer circuit. If the eight output buffer circuits $3B_1$-$3B_8$ are connected to the exclusive reference voltage wiring 5A in accordance with the information from the user, (8+1), that is, the output buffer circuits $3B_1$-$3B'$, of the output buffer circuits are connected to the exclusive reference voltage wiring 5A and the bonding pad corresponding to the output buffer circuit $3B'$ is used as the pad 2A for supplying the reference voltage to the reference voltage wiring 5A. Even if the number of output buffer circuits switching simultaneously with one another changes variously, it is possible to supply the reference voltage to the exclusive reference voltage wiring without adding the pad for supplying the voltage by connecting (n+1) output buffer circuits which switch simultaneously with one another to the exclusive reference voltage wiring and using the bonding pad which corresponds to the substantially excessive output buffer circuit as the pad for supplying the reference voltage to the exclusive reference voltage wiring.

The effects brought forth by the typical invention disclosed herein are briefly as follows.

The power source voltage or the reference potential is supplied to a plurality of output buffer circuits which switch simultaneously with one another by the same and exclusive power source voltage wiring or reference voltage wiring and this exclusive power source voltage wiring or reference voltage wiring is separated from the power source voltage wiring or reference voltage wiring connected to the other output buffer circuits. This circuit arrangement eliminates any adverse influences of the operations of a large number of output buffer circuits switching simultaneously on the other input buffer circuits or output buffer circuits. Accordingly, reliability of the buffer circuits can be improved.

The layout of the wirings described above is conducted by DA by combining the fixed patterns with the connection pattern. According to this arrangement, even when the disposition of a large number of output buffer circuits which switch simultaneously with one another changes variously, the voltage can be supplied to these output buffer circuits through the exclusive wiring which is separate from the reference voltage wiring or the power source voltage wiring to which the other output buffer circuits are connected, by merely changing the disposition of the connection pattern.

Although the present invention has thus been described definitely with reference to the embodiment thereof, the invention is not particularly limited thereto but can of course be changed or modified in various manners without departing from the spirit and scope thereof,.

Figure 9A:
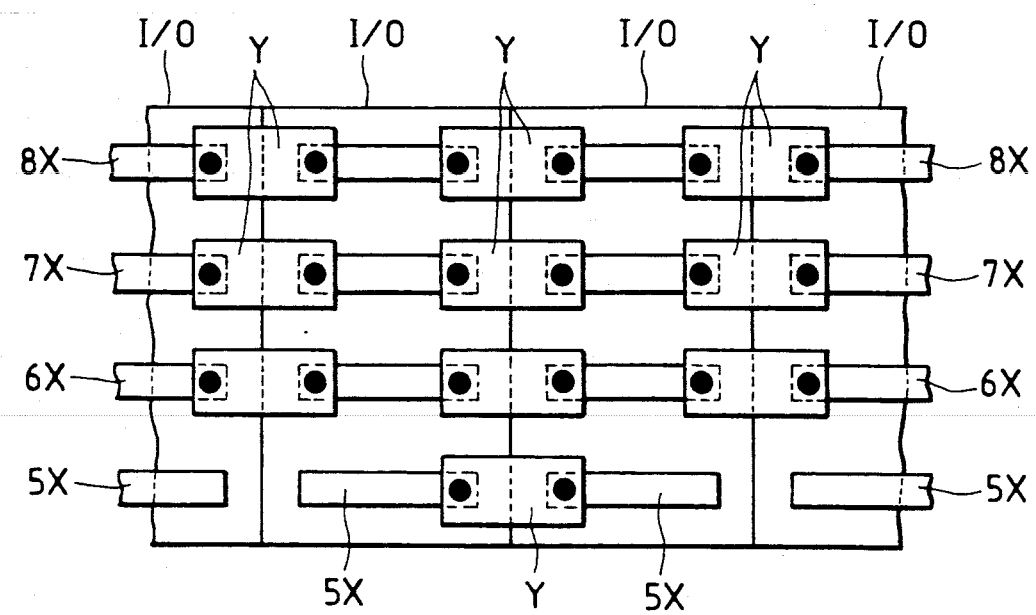
FIGS. 9(a) and 9(b) are diagrams showing modified examples of the wiring design.
Figure 9B:
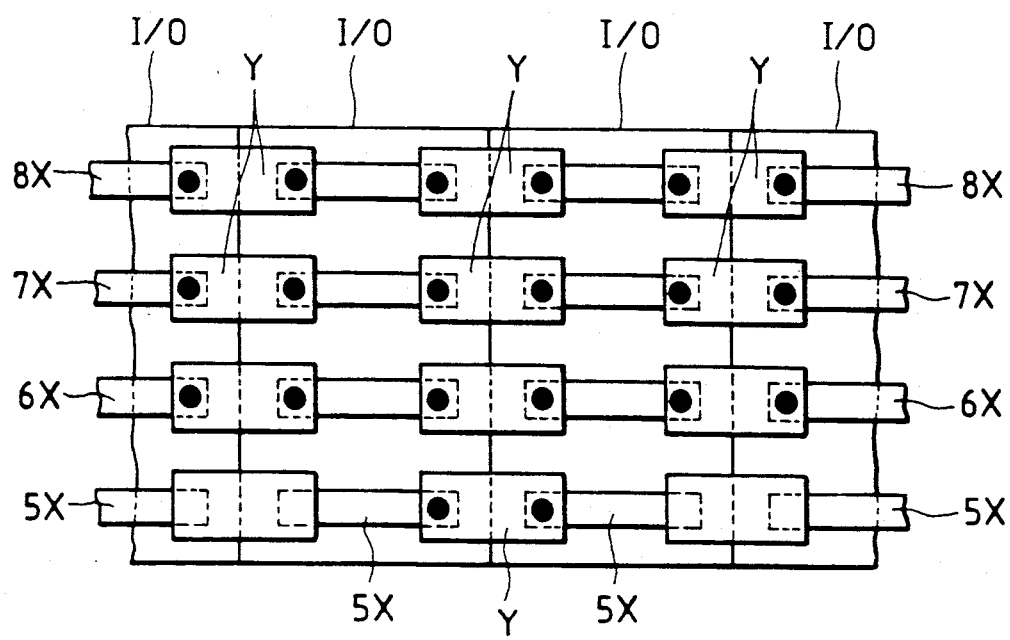

For example, the connection pattern Y for connecting the portions between the fixed patterns 6X, 7X, 8X may be formed by a third layer aluminum film, as shown in FIG. 9(a). The connection portions of the connection pattern Y with the fixed patterns 6X, 7X and 8X are represented by black circles. The connection pattern Y may be replaced by wires. It is also possible to make the design of the wirings 5, 5A, 6, 7, 8 by disposing the connection patterns Y between the fixed patterns 5X and 5X, between 6X and 6X, between 7X and 7X and between 8X and 8X and deciding the design depending on whether or not the connection portions are to be disposed between the connection patterns Y and the fixed patterns 5X, 6X, 7X, 8X, respectively, as shown in FIG. 9(b).

What is claimed is:

1. A semiconductor integrated circuit device comprising:
   a semiconductor substrate having a main surface;
   a plurality of basic cell lines each of which arranges basic cells having a plurality of transistors, said basic cell lines being positioned at an internal circuit area on said main surface of the semiconductor substrate;
   output buffer circuits being formed in input/output (I/O) areas on said main surface of the semiconductor substrate and being positioned around said internal circuit area, said output buffer circuits including first output buffer circuits which are characterized as providing output levels, at respective outputs thereof, which switch substantially simultaneously from one level to another level thereof and second output buffer circuits which are characterized as providing output levels, at respective outputs thereof, associated with switching times that are not simultaneous with that of a said first output buffer circuits;
   a first wiring, extending on said I/O areas, for supplying a first fixed potential to said first output buffer circuits; and
   a second wiring, extending on said I/O areas, for supplying the first fixed potential to said second output buffer circuits, said second wiring being separated from said first wiring.

2. A semiconductor integrated device according to claim 1, wherein said semiconductor integrated circuit device is a gate array type semiconductor integrated circuit device.

3. A semiconductor integrated circuit device according to claim 1, wherein each one of said basic cells comprises p-channel MISFETs and N-channel MISFETs.

4. A semiconductor integrated circuit device according to claim 1, wherein said first wiring corresponds to a same level metal wiring which is formed on said semiconductor substrate as said second wiring.

5. A semiconductor integrated circuit device according to claim 1, wherein said first wiring is a reference voltage wiring.

6. A semiconductor integrated circuit device according to claim 1, which further includes:
   a third wiring for supplying a second fixed potential to said first and second output buffer circuits, said third wiring extending on said I/O areas;
   a fourth wiring, extending on said I/O areas, for supplying said first fixed potential to said internal circuit area and to input buffer circuits formed in said I/O areas; and
   a fifth wiring, extending on said I/O areas, for supplying said second fixed potential to said internal circuit area and to said input buffer circuits.

7. A semiconductor integrated circuit device according to claim 6, wherein said first fixed potential is a reference potential and said second fixed potential is a power source potential.

8. A semiconductor integrated circuit device comprising:
   a semiconductor substrate having a main surface;
   internal circuits being disposed at an internal circuit area on said main surface of the semiconductor substrate;
   output buffer circuits being formed input/output (I/O) areas on said main surface of the semiconductor substrate and being disposed around said internal circuit area, said output buffer circuits including first output buffer circuits which are characterized as providing output levels, at respective outputs thereof, which switch substantially simultaneously from one to another level thereof and second output buffer circuits which are characterized as providing output levels, at respective outputs thereof, associated with switching times that are not simultaneous with that of said first output buffer circuits;
   a first wiring, extending on said I/O areas, for supplying a first fixed potential to said first output buffer circuits; and
   a second wiring, extending on said I/O areas, for supplying said first fixed potential to said second output buffer circuits, said second wiring being separated from said first wiring.

9. A semiconductor integrated circuit device according to claim 8, further including:
   a third wiring, extending on said I/O areas, for supplying a second fixed potential to said first and second output buffer circuits.

10. A semiconductor integrated circuit device according to claim 9, further including:
    a first bonding pad for said first fixed potential electrically connected to said first wiring, and a second bonding pad for said first fixed potential electrically connected to said second wiring.

11. A semiconductor integrated circuit device according to claim 10, wherein said first fixed potential is a reference potential, and said second fixed potential is a power source potential.

12. A semiconductor integrated circuit device according to claim 11, wherein said I/O areas are disposed so as to surround said internal circuit area.

13. A semiconductor integrated circuit device according to claim 12, wherein the first and second bonding pads are disposed on said semiconductor substrate further away from said internal circuit area than are said I/O areas.

14. In a semiconductor integrated circuit device including a semiconductor substrate having a main surface which has an internal circuit area and input/output (I/O) areas which are disposed around said internal circuit area, said I/O areas corresponding to areas where input buffer circuits and output buffer circuits are to be formed, and said internal circuit area corresponding to an area where internal circuits are to be formed, a method of designing wirings for supplying a fixed potential to said I/O areas, said method comprising the steps of:

arranging a fixed pattern of said wirings for each of said I/O areas such that said fixed patterns of said I/O areas adjacent to one another are separated with a predetermined distance mutually; and disposing a connection pattern for connecting mutually said fixed patterns located on said adjacent I/O areas, thereby effecting a connection of the fixed patterns between adjacent I/O areas in the arrangement such that there exist between said fixed patterns on said adjacent I/O areas those portions where said connection patterns are disposed and those portions where they are not disposed.

15. A semiconductor integrated circuit device according to claim 14, wherein said first fixed potential is a reference potential.

16. A semiconductor integrated circuit device according to claim 15, wherein said I/O areas are disposed so as to surround said internal circuit area, and said wirings are formed to extend on said I/O areas.

17. A designing method of wirings according to claim 15, wherein said connection patterns are disposed between fixed patterns on said adjacent I/O areas such that a wiring which is effected for supplying said fixed potential to a group from said output buffer circuits whose outputs switch simultaneously is laid out separately from other ones of said wirings for supplying said fixed potential to other ones of said output buffer circuits.

18. A designing method of wirings according to claim 17, wherein said fixed pattern and said connection pattern are formed by an electrically conductive layer corresponding to a same level layer as that of said wirings.

19. A designing method of wirings according to claim 18, wherein said designing method is employed by Design Automation.

20. A designing method of wirings according to claim 17, wherein said connection pattern is formed by an electrically conductive layer corresponding to a higher level layer than that of said fixed pattern.

21. A designing method of wirings according to claim 20, wherein said designing method is employed by Design Automation.

22. A designing method of wirings according to claim 15, wherein said fixed pattern and said connection pattern are formed by an electrically conductive layer corresponding to a same level layer as that of said wirings.

23. A designing method of wirings according to claim 15, wherein said designing method is employed by Design Automation.

24. A designing method of wirings according to claim 15, wherein said connectioin pattern is formed by an electrically conductive layer corresponding to a higher level layer than that of said fixed pattern.

25. In a semiconductor integrated circuit device including a semiconductor substrate having a main surface which has an internal circuit area and input/output (I/O) areas which are disposed so as to surround said internal circuit area, said I/O areas corresponding to areas where input buffer circuits and output buffer circuits are to be formed, and said internal circuit area corresponding to an area where internal circuits are to be formed, a method of designing wirings, which extend on said I/O areas, for supplying a reference potential to said I/O areas, said method comprising the steps of:

arranging a fixed pattern of said wirings for each of said I/O areas such that said fixed patterns of said I/O areas adjacent to one another are separated with a predetermined distance mutually; and arranging a connection pattern for connecting mutually said fixed patterns located on said adjacent I/O areas, thereby effecting a connection of the fixed patterns between adjacent I/O areas in the arrangement such that there exist between said fixed patterns on said adjacent I/O areas those portions where connection portions for electrically connecting between said connection pattern and said fixed patterns on said adjacent I/O areas are disposed and those portions were they are not disposed.

26. A designing method of wirings according to claim 25, wherein said connection pattern is formed by an electrically conductive layer corresponding to a higher level layer than that of said fixed pattern.

27. In a semiconductor integrated circuit device including a semiconductor substrate having a main surface which has an internal circuit area including a plurality of basic cell lines each formed by arranging repeatedly basic cells each having a plurality of transistors formed on a semiconductor substrate; and input/output (I/O) areas disposed at peripheral portions of said internal circuit area and having formed therein input buffer circuits and output buffer circuits, wherein a a plurality of said output buffer circuits have outputs providing output levels which switch substantially simultaneously from one level to another level thereof, a method of designing wirings which extend on said I/O areas and supply a fixed potential to said output buffer circuits, said method comprising the steps of:

arranging a fixed pattern of said wirings for each of said I/O areas such that said fixed patterns of said I/O areas adjacent to one another are not connected mutually; and disposing a connection pattern for connecting mutually said fixed patterns located on said adjacent I/O areas, thereby effecting a connection of the fixed patterns between adjacent I/O areas in the arrangement such that there exist between said fixed patterns on said adjacent I/O areas those portions where said connection patterns are disposed and those portions where they are not disposed.

28. A designing method of wirings according to claim 27, wherein said connection patterns are disposed between fixed patterns on said adjacent I/O areas such that a wiring which is effected for supplying said fixed potential to said plurality of output buffer circuits whose outputs switch simultaneously is laid out separately from other ones of said wirings for supplying said fixed potential to other ones of said output buffer circuits.

29. A designing method of wirings according to claim 28, wherein said fixed pattern and said connection pattern are formed by an electrically conductive layer corresponding to a same level layer as that of said wiring.

30. A designing method of wirings according to claim 28, wherein said connection pattern is formed by an electrically conductive layer corresponding to a higher level layer than that of said fixed pattern.

31. A designing method of wirings according to claim 28, wherein said designing method is employed by Design Automation.

32. A designing method of wirings according to claim 27, wherein said fixed pattern and said connection pattern are formed by an electrically conductive layer corresponding to a same level layer as that of said wirings.

33. A designing method of wirings according to claim 27, wherein said connection pattern is formed by an electrically conductive layer corresponding to a higher level layer than that of said fixed pattern.

34. A designing method of wirings according to claim 27, wherein said designing method is employed by Design Automation.

* * * * *